United States Patent [19]

Yamaguchi

[11] Patent Number: 5,786,733

[45] Date of Patent: Jul. 28, 1998

[54] PHASE-LOCKED OSCILLATING CIRCUIT WITH A FREQUENCY FLUCTUATION DETECTING CIRCUIT

[75] Inventor: Shigenori Yamaguchi, Tokyo, Japan

[73] Assignee: NEC Corporation, Tokyo, Japan

[21] Appl. No.: 759,832

[22] Filed: Dec. 4, 1996

[30] Foreign Application Priority Data

Dec. 4, 1995 [JP] Japan ................... 7-315215

[51] Int. Cl.[6] .............................. H03L 7/093; H03L 7/18
[52] U.S. Cl. ................... 331/11; 331/16; 331/17; 331/25
[58] Field of Search ................. 331/10, 11, 16, 331/17, 25

[56] References Cited

U.S. PATENT DOCUMENTS

| | | | |
|---|---|---|---|
| 4,021,752 | 5/1977 | Sato et al. | 331/17 |
| 4,972,160 | 11/1990 | Sylvain | 331/17 |
| 5,086,421 | 2/1992 | Tateishi | 369/50 |
| 5,168,246 | 12/1992 | Pulluru et al. | 331/17 |

FOREIGN PATENT DOCUMENTS

| | | |
|---|---|---|
| 1-129615 | 5/1989 | Japan . |
| 5-129951 | 5/1993 | Japan . |

*Primary Examiner*—Siegfried H. Grimm
*Attorney, Agent, or Firm*—Foley & Lardner

[57] ABSTRACT

In a phase-locked oscillating circuit comprising a voltage-controlled oscillator responsive to a control voltage for generating an output signal having an output frequency and a variable gain amplifier having a controllable gain and supplying the voltage-controlled oscillator with the control voltage, a frequency fluctuation detecting circuit detects fluctuation in the output frequency of the output signal to control the controllable gain on the basis of magnitude of the fluctuation in the output frequency of the output signal. The phase-locked oscillating circuit may comprise a reference voltage generating circuit for supplying the variable gain amplifier with a controllable reference voltage in response to the control voltage. The phase-locked oscillating circuit may comprise a selector for selecting one of original reference signals as a selected reference signal and an input frequency divider for frequency dividing the selected reference signal to produce an input divided signal which is supplied to a phase-frequency comparator. The input frequency divider may include a detection circuit for detecting absence of the selected reference signal to produce an input absence signal on absence of the selected reference signal. Responsive to the input absence signal, a digital signal processor holds a digital phase difference signal produced immediately before as a held digital phase difference signal.

18 Claims, 8 Drawing Sheets

PHASE-LOCKED OSCILLATING CIRCUIT WITH A FREQUENCY FLUCTUATION DETECTING CIRCUIT

BACKGROUND OF THE INVENTION

This invention relates to a phase-locked oscillating circuit defining an output frequency and an output phase of an output signal by phase-frequency comparing a reference signal with the output signal and, more particularly, a phase-locked oscillating circuit comprising a voltage-controlled oscillator supplied with a control voltage into which a digital signal having a predetermined number of bits indicative of a phase difference is converted.

Phase-locked oscillating circuits are classified into two types. That is, each of the phase-locked oscillating circuits of a first type comprises, as an oscillator, a voltage-controlled oscillator of an analog type. Each of the phase-locked oscillating circuits of a second type comprises, as the oscillator, a digital voltage-controlled oscillator composed of digital circuits. Furthermore, the phase-locked oscillating circuits of a first type are classified into ones composed of analog circuits alone and others in which a part is composed of digital circuits.

The phase-locked oscillating circuit composed of the analog circuits alone comprises a voltage-controlled oscillator, a frequency divider, a phase-frequency comparator, and a low pass filter. Responsive to a control voltage, the voltage-controlled oscillator generates an output signal having an output frequency. Connected to the voltage-controlled oscillator, the frequency divider divides the output signal on the basis of a predetermined dividing number to produce a divided signal. Connected to the frequency divider and supplied with a reference signal having a reference frequency, the phase-frequency comparator detects a phase-frequency difference between the divided signal and the reference signal to produce a phase-frequency difference signal indicative of the phase-frequency difference. Connected to the phase-frequency comparator, the low pass filter extracts low frequency components from the phase-frequency difference signal to produce a phase difference signal indicative of the low frequency components of the phase-frequency difference signal. The phase difference signal is supplied to the voltage-controlled oscillator as the control voltage which defines an oscillation frequency or the output frequency of the phase-locked oscillating circuit.

As contrast with this, the phase-locked oscillating circuit composed of the digital circuits as the part is similar in structure to the phase-locked oscillating circuit composed of the analog circuits alone except that a digital signal processing circuit is used as a circuit performing a function of the low pass filter. The digital signal processing circuit produces a digital phase difference signal indicative of the low frequency components of the phase-frequency difference signal. The digital phase difference signal is converted into an analog phase difference voltage by a digital-to-analog converter. The analog phase difference voltage is supplied to the voltage-controlled oscillator as the control voltage. Such a phase-locked oscillating circuit is disclosed in Japanese Unexamined Patent Prepublication of Kokai No. Hei 5-129,951, namely, 129,951/1993.

The oscillation frequency in the phase-locked oscillating circuit can be changed by changing the predetermined dividing number in the frequency divider for frequency dividing the output signal of the voltage-controlled oscillator. In this case, however, the oscillation frequency is discretely changed by the predetermined dividing number as a unit alone. In order to change the oscillation frequency by a range less than the above-mentioned unit, changing is normally made as regards the reference frequency of the reference signal which is supplied to the phase-frequency comparator. This is implemented by switching a plurality of crystal oscillators for oscillating a plurality of reference signals having reference frequencies which are different from one another. In the phase-locked oscillating circuit comprising the digital signal processing circuit such as the phase-locked oscillating circuit according to Kokai No. Hei 5-129,951, the oscillation frequency in the phase-locked oscillating circuit can be changed by changing constants for use in digital processing or calculation.

Another phase-locked oscillating circuit is disclosed in Japanese Unexamined Patent Prepublication of Kokai No. Hei 1-129,615, namely, 129,615/1989. According to Kokai No. Hei 1-129,615, the phase-locked oscillator comprises a conversion gain switching circuit which is inserted between the low pass filter and the voltage-controlled oscillator. The conversion gain switching circuit comprises a potential divider which consists of capacitors as impedance elements and a switching circuit for switching whether or not an output voltage of the low pass filter is divided. Between the time when oscillation is started and the time when pull-in is completed, the output voltage of the low pass filter is supplied to the voltage-controlled oscillator as the control voltage without potential division. After the pull-in is completed so that an oscillation state is stabilized, a divided voltage into which the the output voltage of the low pass filter is divided by the potential divider is supplied to the voltage-controlled oscillator as the control voltage. As a result, shortening of a pull-in time as well as stabilization of the oscillation frequency after the pull-in are achieved.

Inasmuch as the minimum unit enable to changing of the oscillation frequency is defined in the phase-locked oscillating circuit comprising the digital voltage-controlled oscillator, it is impossible to make precision of the oscillation frequency higher than the minimum unit. In addition, inasmuch as only a plurality of fixed oscillation frequencies are obtained in the phase-locked oscillating circuit which changes the reference frequencies of the reference signals by changing the crystal oscillators, it is impossible to oscillate the output signal having an arbitrary output frequency. Furthermore, inasmuch as the minimum unit enable of changing the oscillation frequency is defined by resolution in the digital-to-analog converter in the phase-locked oscillating circuit which comprises the voltage-controlled oscillator supplied with the control voltage converted by the digital-to-analog converter, it is impossible to accurately obtain a desired oscillation frequency. In order to improve precision of the oscillation frequency, precision of the voltage-controlled oscillator must be improved. This is because the resolution in the digital-to-analog converter is limited. When the precision of the voltage-controlled oscillator is improved, the phase-locked oscillating circuit has a high cost. In addition, the more the precision of the voltage-controlled oscillator is improved, the narrower a variable range in the oscillation frequency will be.

In the art disclosed in Kokai No. Hei 1-129,615, the potential divider is composed of capacitors. As a result, a pass band property of the low pass filter changes in accordance with a condition whether the potential divider is connected to low pass filter or disconnected from the low pass filter. In addition, it is impossible to suitably stabilize the oscillation frequency when magnitude of fluctuation in the oscillation frequency is large in a condition where the potential divider is connected to the low pass filter. This is because the magnitude of the fluctuation of the oscillation frequency is not monitored.

Furthermore, the conventional phase-locked oscillating circuit is disadvantageous in that it is impossible to control the oscillation frequency when the reference signal is absent. This is because a phase difference is not detected. In addition, the conventional phase-locked oscillating circuit is also disadvantageous in that, when the reference signal from a crystal oscillator is switched to another reference signal from another crystal oscillator, it is impossible to carry out stable oscillation due to a rapid phase fluctuation in the reference signal before and after switching.

SUMMARY OF THE INVENTION

It is therefore an object of this invention to provide a phase-locked oscillating circuit which has a wide pull-in range.

It is another object of this invention to provide a phase-locked oscillating circuit of the type described, which is capable of oscillating an output signal having an arbitrary stable output frequency.

It is still another object of this invention to provide a phase-locked oscillating circuit of the type described, which is capable of carry out stable oscillation continuously even though a reference signal is absent.

It is yet another object of this invention to provide a phase-locked oscillating circuit of the type described, which is capable of carry out stable oscillation continuously even though a reference signal is switched from one frequency to another.

Other objects of this invention will become clear as the description proceeds.

According to a first aspect of this invention, a phase-locked oscillating circuit comprises a voltage-controlled oscillator responsive to a control voltage for generating an output signal having an output frequency. Connected to the voltage-controlled oscillator, a frequency divider divides the output signal on the basis of a predetermined dividing number to produce a divided signal. Connected to the frequency divider and supplied with a reference signal having a reference frequency, a phase-frequency comparator detects a phase-frequency difference between the divided signal and the reference signal to produce a phase-frequency difference signal indicative of the phase-frequency difference. Connected to the phase-frequency comparator, digital signal processing means extracts low frequency components from the phase-frequency difference signal to produce a digital phase difference signal indicative of the low frequency components of the phase-frequency difference signal. Connected to the digital processing means, a digital-to-analog converter converts the digital phase difference signal into an analog phase difference voltage. Connected to the digital-to-analog converter and the voltage-controlled oscillator, a variable gain amplifier has a controllable gain and amplifies the analog phase difference voltage on the basis of the controllable gain into an amplified phase difference voltage. The variable gain amplifier supplies the voltage-controlled oscillator with the amplified phase difference voltage as the control voltage. Connected to the voltage-controlled oscillator and the variable gain amplifier, frequency fluctuation detecting means detects fluctuation in the output frequency of the output signal to control the controllable gain on the basis of magnitude of the fluctuation in the output frequency of the output signal.

According to a second aspect of this invention, a phase-locked oscillating circuit comprises a voltage-controlled oscillator responsive to a control voltage for generating an output signal having an output frequency. Connected to the voltage-controlled oscillator, a frequency divider divides the output signal on the basis of a predetermined dividing number to produce a divided signal. Connected to the frequency divider and supplied with a reference signal having a reference frequency, a phase-frequency comparator detects a phase-frequency difference between the divided signal and the reference signal to produce a phase-frequency difference signal indicative of the phase-frequency difference. Connected to the phase-frequency comparator, digital signal processing means extracts low frequency components from the phase-frequency difference signal to produce a digital phase difference signal indicative of the low frequency components of the phase-frequency difference signal. Connected to the digital processing means, a digital-to-analog converter converts the digital phase difference signal into an analog phase difference voltage. Supplied with a controllable reference voltage and connected to the digital-to-analog converter and the voltage-controlled oscillator, a variable gain amplifier has a controllable gain and amplifies a difference voltage between the analog phase difference voltage and the controllable reference voltage on the basis of the controllable gain into an amplified phase difference voltage. The variable gain amplifier supplies the voltage-controlled oscillator with the amplified phase difference voltage as the control voltage. Connected to the voltage-controlled oscillator and the variable gain amplifier, frequency fluctuation detecting means detects fluctuation in the output frequency of the output signal to control the controllable gain on the basis of magnitude of the fluctuation in the output frequency of the output signal. Connected to the variable gain amplifier, reference voltage generating means supplies the variable gain amplifier with the controllable reference voltage in response to the control voltage.

According to a third aspect of this invention, a phase-locked oscillating circuit comprises a voltage-controlled oscillator responsive to a control voltage signal for generating an output signal having an output frequency. Connected to the voltage-controlled oscillator, a first frequency divider divides the output signal on the basis of a first dividing number to produce a first divided signal. Supplied with a plurality of original reference signals having original reference frequencies, selecting means selects one of the original reference signals as a selected reference signal. Connected to the selecting means, a second frequency divider frequency divides the selected reference signal on the basis of a second dividing number to produce a second divided signal. Connected to the first and the second frequency dividers, a phase-frequency comparator detects a phase-frequency difference between the first and the second divided signals to produce a phase-frequency difference signal indicative of the phase-frequency difference. Connected to the phase-frequency comparator, digital signal processing means extracts low frequency components from the phase-frequency difference signal to produce a digital phase difference signal indicative of the low frequency components of the phase-frequency difference signal. Connected to the digital processing means, a digital-to-analog converter converts the digital phase difference signal into an analog phase difference voltage. Supplied with a controllable reference voltage and connected to the digital-to-analog converter and the voltage controlled oscillator, a variable gain amplifier has a controllable gain and amplifies a difference voltage between the analog phase difference voltage and the controllable reference voltage on the basis of the controllable gain into an amplified phase difference voltage. The variable gain amplifier supplies the voltage-controlled oscillator with the amplified phase difference voltage as the control voltage. Connected to the voltage-controlled oscillator and the variable gain amplifier, frequency fluctuation detecting means detects fluctuation in the output frequency of the output signal to control the controllable gain on the basis of magnitude of the fluctuation in the output frequency of the output signal. Connected to the variable gain amplifier, reference voltage generating means supplies the variable gain amplifier with the controllable reference voltage in response to the control voltage.

According to a fourth aspect of this invention, a phase-locked oscillating circuit comprises a voltage-controlled oscillator responsive to a control voltage signal for generating an output signal having an output frequency. Connected to the voltage-controlled oscillator, a frequency divider divides the output signal on the basis of a predetermined dividing number to produce a divided signal. Connected to the frequency dividers and supplied with a reference signal having a reference frequency, a phase-frequency comparator detects a phase-frequency difference between the divided signal and the reference signal to produce a phase-frequency difference signal indicative of the phase-frequency difference. Signal absence detecting means detects absence of the reference signal to produce an input absence signal on absence of the reference signal. Connected to the phase-frequency comparator and the signal absence detecting means, digital signal processing means extracts low frequency components from the phase-frequency difference signal to produce a digital phase difference signal indicative of the low frequency components of the phase-frequency difference signal. Responsive to the input absence signal, the digital signal processing means holds the digital phase difference signal produced immediately before as a held digital phase difference signal. Connected to the digital processing means, a digital-to-analog converter converts the held digital phase difference signal into an analog phase difference voltage. Supplied with a controllable reference voltage and connected to the digital-to-analog converter and the voltage-controlled oscillator, a variable gain amplifier has a controllable gain and amplifies a difference voltage between the analog phase difference voltage and the controllable reference voltage on the basis of the controllable gain into an amplified phase difference voltage. The variable gain amplifier supplies the voltage-controlled oscillator with the amplified phase difference voltage as the control voltage. Connected to the voltage-controlled oscillator and the variable gain amplifier, frequency fluctuation detecting means detects fluctuation in the output frequency of the output signal to control the controllable gain on the basis of magnitude of the fluctuation in the output frequency of the output signal. Connected to the variable gain amplifier, reference voltage generating means supplies the variable gain amplifier with the controllable reference voltage in response to the control voltage.

DESCRIPTION OF THE PREFERRED EMBODIMENTS

Figure 1:
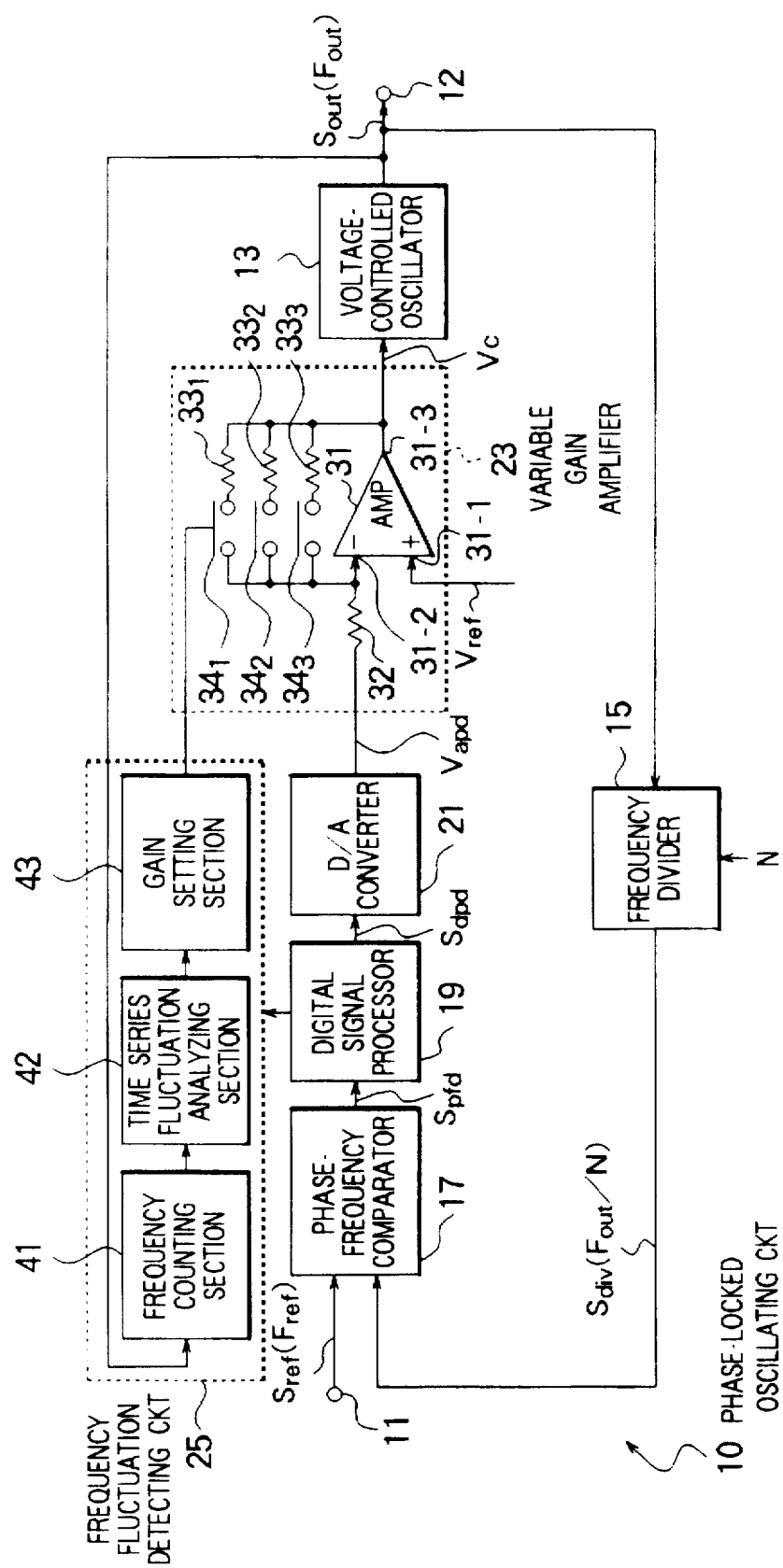
FIG. 1 is a block diagram of a phase-locked oscillating circuit according to a first embodiment of this invention.

Referring to FIG. 1, the description will proceed to a phase-locked oscillating circuit 10 according to a first embodiment of this invention. The illustrated phase-locked oscillating circuit 10 has an input terminal 11 supplied with a reference signal $S_{ref}$ with a reference frequency $F_{ref}$ and an output terminal 12 for outputting an output signal $S_{out}$ having an output frequency $F_{out}$. The phase-locked oscillating circuit 10 makes the phase of the output signal $S_{out}$ follow exactly the phase of the reference signal $S_{ref}$ by comparing the phases between the reference signal $S_{ref}$ and the output signal $S_{out}$.

The phase-locked oscillating circuit 10 comprises a voltage-controlled oscillator 13, a frequency divider 15, a phase-frequency comparator 17, a digital signal processor 19, a digital-to-analog converter 21, a variable gain amplifier 23, and a frequency fluctuation detecting circuit 25.

The voltage-controlled oscillator 13 is supplied with a control voltage $V_c$ which will later become clear. Responsive to the control voltage $V_c$, the voltage-controlled oscillator 13 generates the output signal $S_{out}$ having the output frequency $F_{out}$. The output signal $S_{out}$ is supplied to the frequency divider 15 and the frequency fluctuation detecting circuit 25.

The frequency divider 15 is connected to the voltage controlled oscillator 13 and has a predetermined dividing number N which defines the output frequency $F_{out}$, where N represents a positive integer which is not less than two. The frequency divider 15 frequency divides the output signal $S_{out}$ on the basis of the pre-determined dividing number N to produce a divided signal $S_{div}$ having a divided frequency $F_{out}/N$. In other words, the frequency divider 15 is for frequency dividing the output signal $S_{out}$ by a factor 1/N. The divided signal $S_{div}$ is supplied to the phase-frequency comparator 17.

The phase-frequency comparator 17 is connected to the frequency divider 15 and is supplied with the reference signal $S_{ref}$ having the reference frequency $F_{ref}$ from the input terminal 11. The phase-frequency comparator 17 detects a phase-frequency difference between the reference signal $S_{ref}$ and the divided signal $S_{div}$ to produce a phase-frequency difference signal $S_{pfd}$ indicative of the phase-frequency difference. The phase-frequency difference signal $S_{pfd}$ indicates one of lag and lead phases which the divided signal $S_{div}$ has in comparison with the reference signal $S_{ref}$. The phase-frequency difference signal $S_{pfd}$ is supplied to the digital signal processor 19.

The digital signal processor 19 is connected to the phase-frequency comparator 17. The digital signal processor 19 is composed of digital circuits and serves as a low-pass filter. The digital signal processor 19 extracts low frequency components from the phase-frequency difference signal $S_{pfd}$ to produce a digital phase difference signal $S_{dpd}$ indicative of the low frequency components of the phase-frequency difference signal $S_{pfd}$. The digital phase difference signal $S_{dpd}$ is represented by a predetermine number of bits. The digital phase difference signal $S_{dpd}$ is supplied to the digital-to-analog converter 21.

The digital-to-analog converter 21 is connected to the digital signal processor 19. The digital-to-analog converter 21 converts the digital phase difference signal $S_{dpd}$ into an analog phase difference voltage $V_{apd}$. The analog phase difference voltage $V_{apd}$ is supplied to the variable gain amplifier 23.

The variable gain amplifier 23 is connected to the digital-to-analog converter 21 and the voltage-controlled oscillator 13. The variable gain amplifier 23 has a controllable gain where a plurality of gains can be gradually changed. In other words, one of the gains is selected as the controllable gain. The variable gain amplifier 23 is also supplied with a fixed reference voltage $V_{ref}$ into an amplified phase difference voltage. The variable gain amplifier 23 amplifies the analog phase difference voltage $V_{apd}$ on the basis of the controllable gain and the fixed reference voltage $V_{ref}$. The variable gain amplifier 23 supplies the voltage-controlled oscillator 13 with the amplified phase difference voltage as the control voltage.

More specifically, the variable gain amplifier 23 comprises an amplifier 31, an input resistor 32, first through third feedback resistors $33_1$, $33_2$, and $33_3$, and first through third switches $34_1$, $34_2$, and $34_3$. The amplifier 31 has a noninverting input port 31-1, an inverting input port 31-2, and an amplifier output port 31-3. The input resistor 32 has an end supplied with the analog phase difference voltage $V_{apd}$ and another end connected to the inverting input port 31-2 of the amplifier 31. The noninverting input port 31-1 of the amplifier 31 is supplied with the fixed reference voltage $V_{ref}$. Between the inverting input port 31-2 and the amplifier output port 31-3 of the amplifier 23, the first through the third feedback resistors $33_1$ to $33_3$ and the first through the third switches $34_1$ to $34_3$ are disposed.

Particularly, the first switch $34_1$ switches whether or not the first feedback resistor $33_1$ is connected between the inverting input port 31-2 and the amplifier output port 31-3 of the amplifier 31. Similarly, the second switch $34_2$ switches whether or not the second feedback resistor $33_2$ is connected between the inverting input port 31-2 and the amplifier output port 31-3 of the amplifier 31. The third switch $34_3$ switches whether or not the third feedback resistor $33_3$ is connected between the inverting input port 31-2 and the amplifier output port 31-3 of the amplifier 23. The first through the third switches $34_1$ to $34_3$ are controlled by the frequency fluctuation detecting circuit 25 in the manner which will later be described.

The frequency fluctuation detecting circuit 25 is connected to the voltage-controlled oscillator 13 and the variable gain amplifier 23. The frequency fluctuation detecting circuit 25 detects fluctuation in the output frequency $F_{out}$ of the output signal $S_{out}$ to control the controllable gain of the variable gain amplifier 23 on the basis of magnitude of the fluctuation in the output frequency $F_{out}$ in the manner which will later become clear.

More specifically, the frequency fluctuation detecting circuit 25 comprises a frequency counting section 41, a time series fluctuation analyzing section 42, and a gain setting section 43. The frequency counting section 41 is connected to the voltage-controlled oscillator 13. The frequency counting section 41 counts or measures the output frequency $F_{out}$ of the output signal $S_{out}$ to produce a measured frequency signal indicative of the output frequency $F_{out}$. Connected to the frequency counting section 41, the time series fluctuation analyzing section 42 analyzes fluctuation of the output frequency $F_{out}$ in time series in reference with the measured frequency signal to produce a detected frequency fluctuation signal indicative of the magnitude of the fluctuation in the output frequency $F_{out}$ of the output signal $S_{out}$. The gain setting section 43 is connected to time series fluctuation analyzing section 42 and the variable gain amplifier 23. Responsive to the detected frequency fluctuation signal, the gain setting section 43 changes the controllable gain of the variable gain amplifier 23 on the basis of the magnitude of the fluctuation in the output frequency $F_{out}$ by turning the first through the third switches $34_1$ to $34_3$ on or off.

Figure 2:
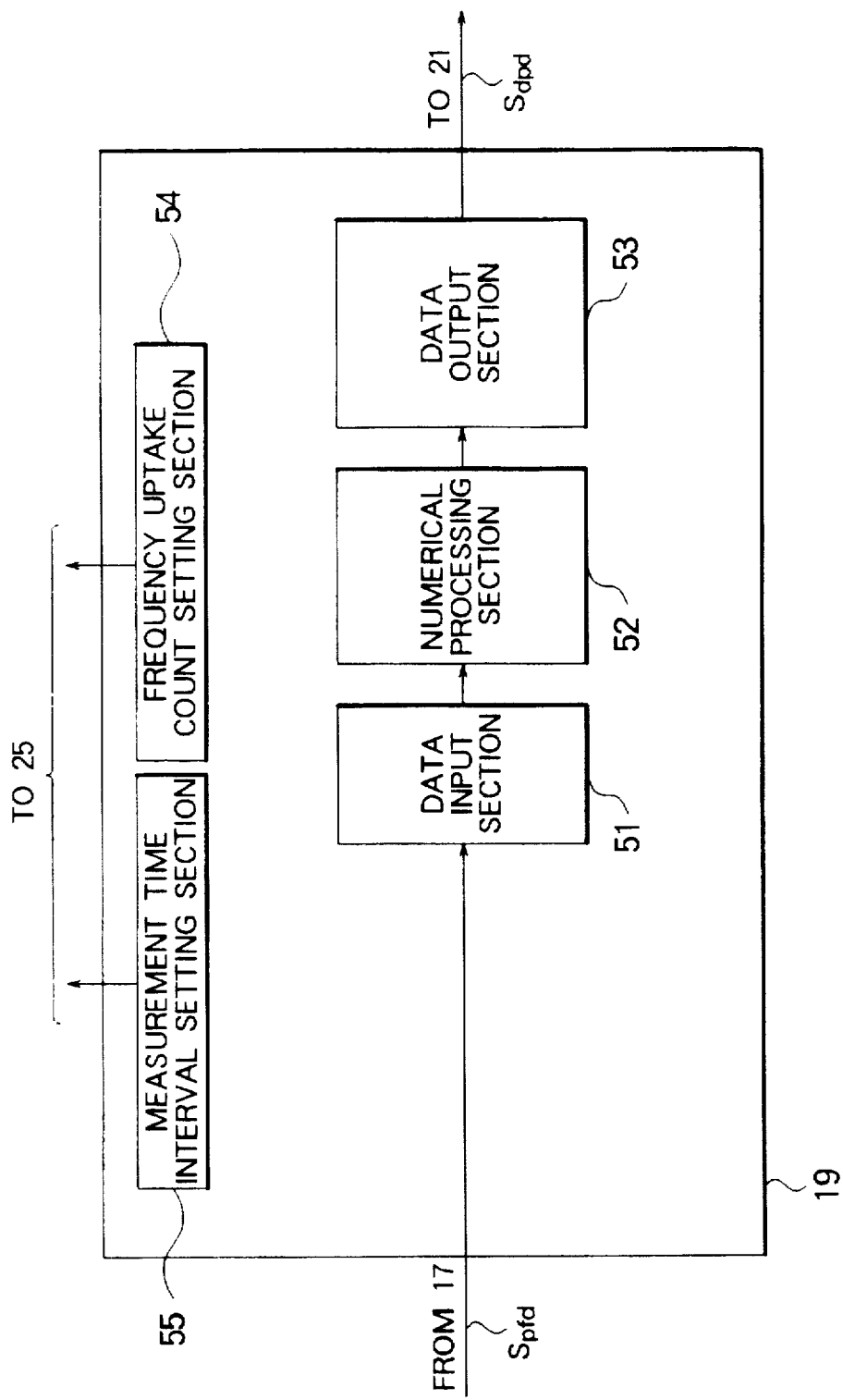
FIG. 2 is a block diagram of a digital signal processor for use in the phase-locked oscillating circuit illustrated in FIG. 1.

Turning to FIG. 2, the digital signal processor 19 comprises a data input section 51, a numerical processing section 52, and a data output section 53. The data input section 51 inputs the phase-frequency difference signal $S_{pfd}$ from the phase-frequency comparator 17. The numerical processing section 52 is connected to the data input section 51. The numerical processing section 52 extracts the low frequency components from the phase-frequency difference signal $S_{pfd}$ to produce the digital phase difference signal $S_{dpd}$. The data output section 53 is connected to the numerical processing section 52. The data output section 53 outputs the digital phase difference signal $S_{dpd}$ to the digital-to-analog converter 21.

The digital signal processor 19 further comprises a frequency uptake count setting section 54 and a measurement time interval setting section 55 which are connected to the frequency fluctuation detection circuit 25. The frequency uptake count setting section 54 sets a frequency uptake count in the frequency fluctuation detecting circuit 25. The measurement time interval setting section 55 sets a measurement time interval signal indicative of a measurement time interval for detecting fluctuation of the output frequency $F_{out}$ in the frequency fluctuation detecting circuit 25.

Description will be made as regards operation of the phase-locked oscillating circuit 10 illustrated in FIG. 1. The output signal $S_{out}$ supplied from the voltage-controlled oscillator 13 is frequency divided by the frequency divider 15 into the divided signal $S_{div}$ which is supplied to the phase-frequency comparator 17. The phase-frequency comparator 17 detects the phase-frequency difference between the reference signal $S_{ref}$ and the divided signal $S_{div}$ to produce the phase-frequency difference signal $S_{pfd}$. The digital signal processor 19 acts as the low pass filter in a phase-locked loop and produces the digital phase difference signal $S_{dpd}$ which corresponds to the phase-frequency difference. The digital phase difference signal $S_{dpd}$ is converted by the digital-to-analog converter 21 into the analog phase difference voltage $V_{apd}$. The amplifier 31 amplifies a voltage difference between the analog phase difference voltage $V_{apd}$ and the fixed reference voltage $V_{ref}$ on the basis of the controllable gain to produce the amplified voltage as the control voltage $V_c$. The control voltage $V_c$ is supplied to the voltage-controlled oscillator 13 to control the output frequency $F_{out}$ of the output signal $S_{out}$.

In the variable gain amplifier 23, the first through the third feedback resistors $33_1$ to $33_3$ have first through third resistance values which are different from one another. When the first switch $34_1$ is turned on so that the first feedback resistor $33_1$ is connected between the inverting input port 31-2 and the amplifier output ports 31-3 of the amplifier 31, the variable gain amplifier 23 has the controllable gain of one as a maximum gain. In addition, when the second switch $34_2$ is turned on so that the second feedback resistor $33_2$ is connected between the inverting input port 31-2 and the amplifier output ports 31-3 of the amplifier 31, the variable gain amplifier 23 has the controllable gain of one-tenths as an intermediate gain. When the third switch $34_3$ is turned on so that the third feedback resistor $33_3$ is connected between the inverting input port 31-2 and the amplifier output ports 31-3 of the amplifier 31, the variable gain amplifier 23 has the controllable gain of one-hundredths as a minimum gain.

When the magnitude of the fluctuation in the output frequency is larger than a first threshold value, the frequency fluctuation detecting circuit 25 turns only the first switch $34_1$ on to make the controllable gain of the variable gain amplifier 23 one. When the magnitude of the fluctuation in the output frequency is not larger than the first threshold value, the frequency fluctuation detecting circuit 25 turns only the second switch $34_2$ on to make the controllable gain of the variable gain amplifier 23 one-tenths. When the magnitude of the fluctuation in the output frequency is not larger than a second threshold value less than the first threshold value, the frequency fluctuation detecting circuit 25 turns only the third switch $34_3$ on to make the controllable gain of the variable gain amplifier 23 one-hundredths.

Figure 3:
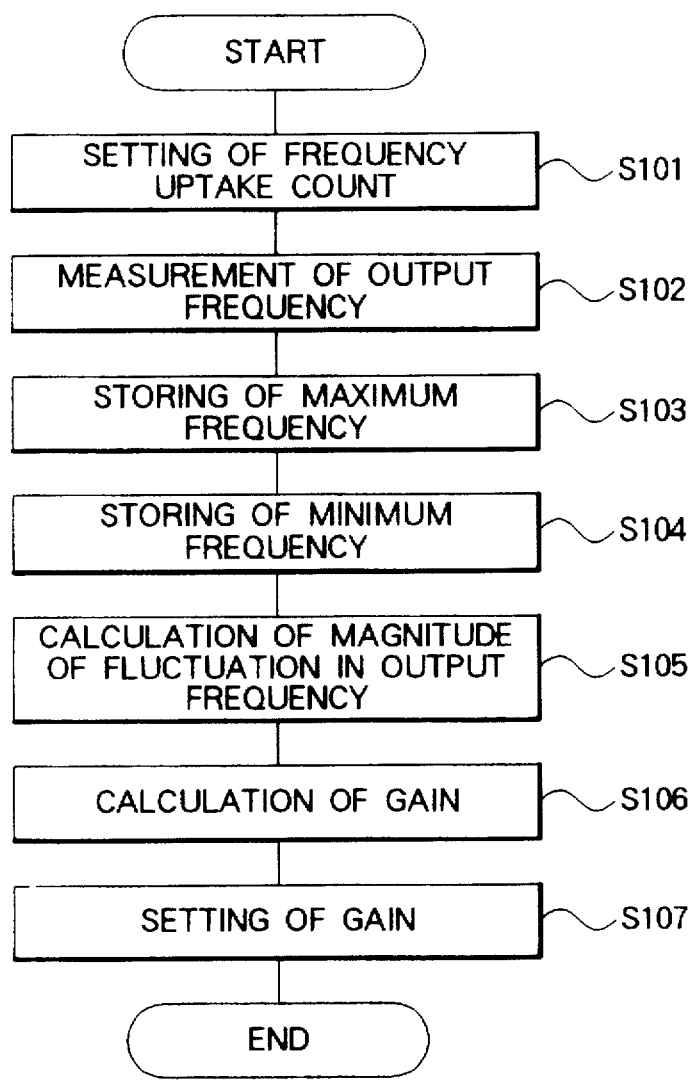
FIG. 3 is a flow chart for use in describing operation of a frequency fluctuation detecting circuit in the the phase-locked oscillating circuit illustrated in FIG. 1.

Turning to FIG. 3, description will be made as regards operation of the frequency fluctuation detecting circuit 25. A frequency uptake count is set in the frequency fluctuation detecting circuit 25 by the frequency uptake count setting section 54 (FIG. 2) of the digital signal processor 19 at a first step S101. The first step S101 is followed by a second step S102 at which the frequency counting section 41 counts, the frequency uptake count times, the number of cycles in the output signal $S_{out}$ during the measurement time interval indicated by the measurement time interval signal. The frequency counting section 41 produces measured frequencies which are equal in number to the frequency uptake count. The time series fluctuation analyzing section 42 stores, in a memory (not shown), a maximum frequency and a minimum frequency in the measured frequencies at third and fourth steps S103 and S104, respectively. Thereafter, the time series fluctuation analyzing section 42 calculates the magnitude of the fluctuation in the output frequency $F_{out}$ on the basis of a frequency difference between the maximum frequency and the minimum frequency as a fifth step S105.

The fifth step S105 proceeds to a sixth step S106 at which the gain setting section 43 calculates a gain in the amplifier 31 on the magnitude of the fluctuation in the output frequency $F_{out}$. In an initial state, the gain setting section 43 sets the maximum gain. The sixth step S106 is succeeded by a seventh step S107 at which the gain setting section 43 selects a minimum one in gain differences between the calculated gain and the gains obtained by connecting the first through the third resistors $33_1$ to $33_3$ to turn the corresponding switch on with remaining switches turned off. The above-mentioned processing is repeatedly carried out and therefore the controllable gain in the variable gain amplifier 23 is sequentially controlled in accordance with the magnitude of the fluctuation in the output frequency $F_{out}$.

With this structure, inasmuch as the variable gain amplifier 23 has the controllable gain of a large value or one when the magnitude of the fluctuation in the output frequency $F_{out}$ is large, the control voltage $V_c$ varies widely and then the voltage-controlled oscillator 13 has a wider frequency variable range. As a result, it is possible to obtain a wide pull-in range of the phase locked oscillating circuit 10. In contrast with this, inasmuch as the variable gain amplifier 23 has the controllable gain of a small value less than one when the magnitude of the fluctuation in the output frequency $F_{out}$ is small, the control voltage $V_c$ varies slightly and then the output frequency $F_{out}$ is minutely controlled. Accordingly, it is possible to obtain the output signal $S_{out}$ having the output frequency $F_{out}$ corresponding to the reference frequency $F_{ref}$ of the reference signal $S_{ref}$ at high precision.

Figure 4:
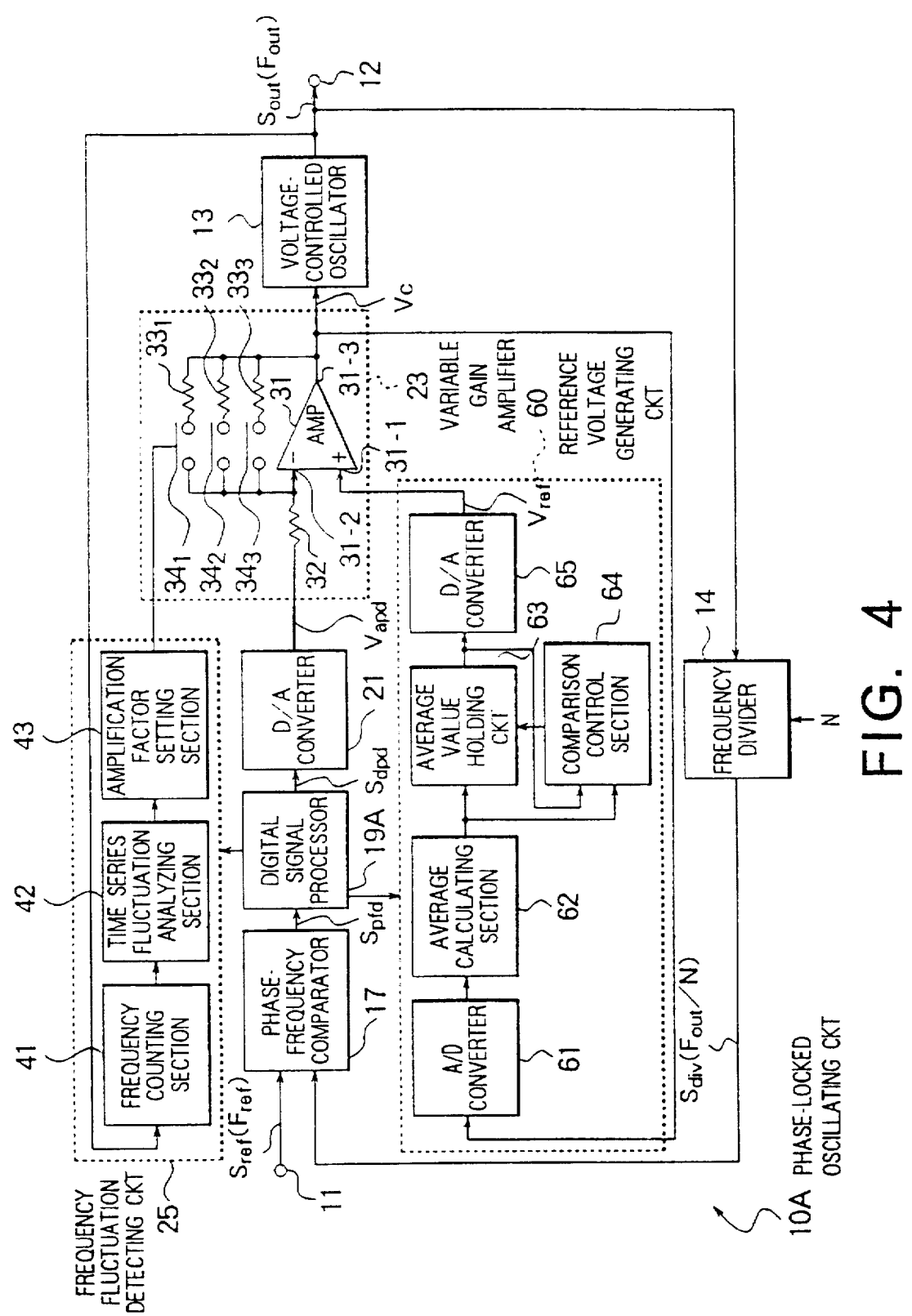
FIG. 4 is a block diagram of a phase-locked oscillating circuit according to a second embodiment of this invention.

Referring to FIG. 4, a phase-locked oscillating circuit 10A according to a second embodiment of this invention is similar in structure to that illustrated in FIG. 1 except that the phase-locked oscillating circuit 10A further comprises a reference voltage generating circuit 60 and the digital signal processor is modified to be different from that described in conjunction with FIG. 1 as will later become clear. The digital signal processor is therefore depicted at 19A.

The reference voltage generating circuit 60 is connected to the variable gain amplifier 23. The reference voltage generating circuit 60 supplies the variable gain amplifier 23 with a controllable reference voltage $V_{ref}$ in response to the control voltage $V_c$ in the manner which become clear as the description proceeds.

More specifically, the reference voltage generating circuit 60 comprises an analog-to-digital converter 61, an average calculating section 62, an average value holding circuit 63, a comparison control section 64, and a digital-to-analog converter 65.

The analog-to-digital converter 61 is connected to the amplifier output port 31-3 of the variable gain amplifier 31. The analog-to-digital converter 61 converts the control voltage $V_c$ into a digital control signal. The digital control signal is supplied to the average calculating section 62. The average calculating section 62 is connected to analog-to-digital converter 61 and is supplied with a control voltage uptake count from the digital signal processor 19A. The average calculating section 62 samples, the control voltage uptake count times, the digital control signal at a predetermined time interval to obtain sampled values which are equal in number to the control voltage uptake count. And then, the average calculating section 62 calculates an average value of the sampled values. The average value indicates an average voltage of the control voltage $V_c$. A combination of the analog-to-digital converter 61 and the average calculating section 62 serves as an average voltage acquisition section for calculating the average voltage by averaging the control voltage $V_c$ during the predetermined time interval.

The average calculating section 62 supplies the average value holding circuit 63 and the comparison control section 64 with a calculated average value. The average value holding circuit 63 holds, in response to a hold indication signal, the calculated average value as a refreshed held average value. The refreshed held average value is supplied to the comparison control section 64 as a previously held average value. The comparison control section 64 compares the previously held average value with the calculated average value. When a difference value between the previously held average value and the calculated average value is not less than a predetermined value, the comparison control section 64 supplies the average value holding circuit 63 with the hold indication signal. The refreshed held average value is supplied to the digital-to-analog converter 65. The calculated average value corresponds to a calculated average voltage while the held average value corresponds to a held average voltage. Therefore, a combination of the average value holding circuit 63 and the comparison control section 64 serves as an average voltage holding section for holding the calculated average voltage as the held average voltage.

The digital-to-analog converter 65 is connected to the average value holding circuit 63. The digital-to-analog converter 65 converts the held average value into the controllable reference voltage $V_{ref}$. That is, the digital-to-analog converter 65 acts as a reference voltage output section for supplying the variable gain amplifier 23 with the held average voltage as the controllable reference voltage $V_{ref}$.

Figure 5:
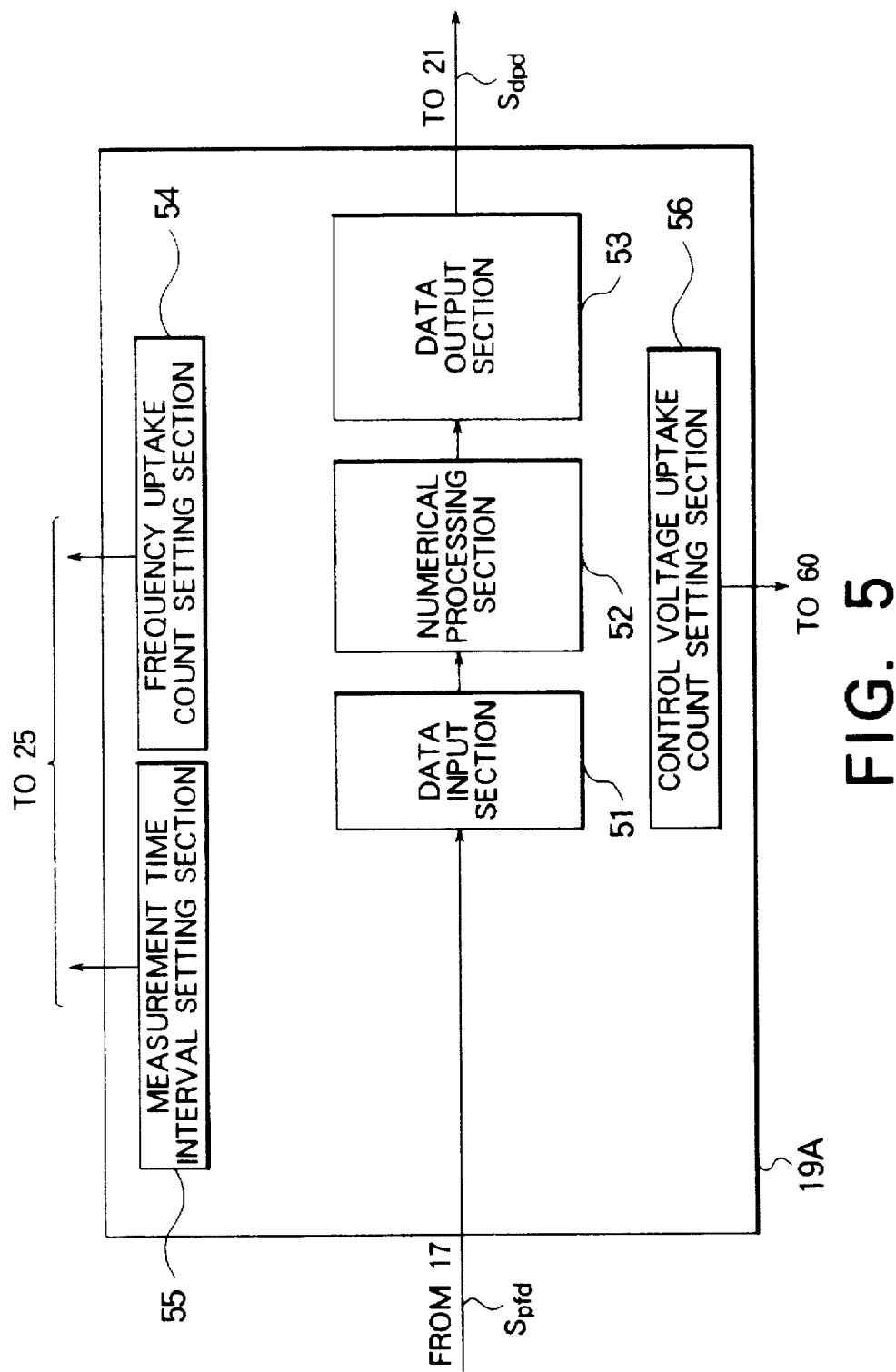
FIG. 5 is a block diagram of a digital signal processor for use in the phase-locked oscillating circuit illustrated in FIG. 4.

Turning to FIG. 5, the digital signal processor 19A is similar in structure to the digital signal processor 19 illustrated in FIG. 2 except that the digital signal processor 19A further comprises a control voltage uptake count setting section 56. The control voltage uptake count setting section 56 sets the control voltage uptake count in the reference voltage generating section 60.

Figure 6:
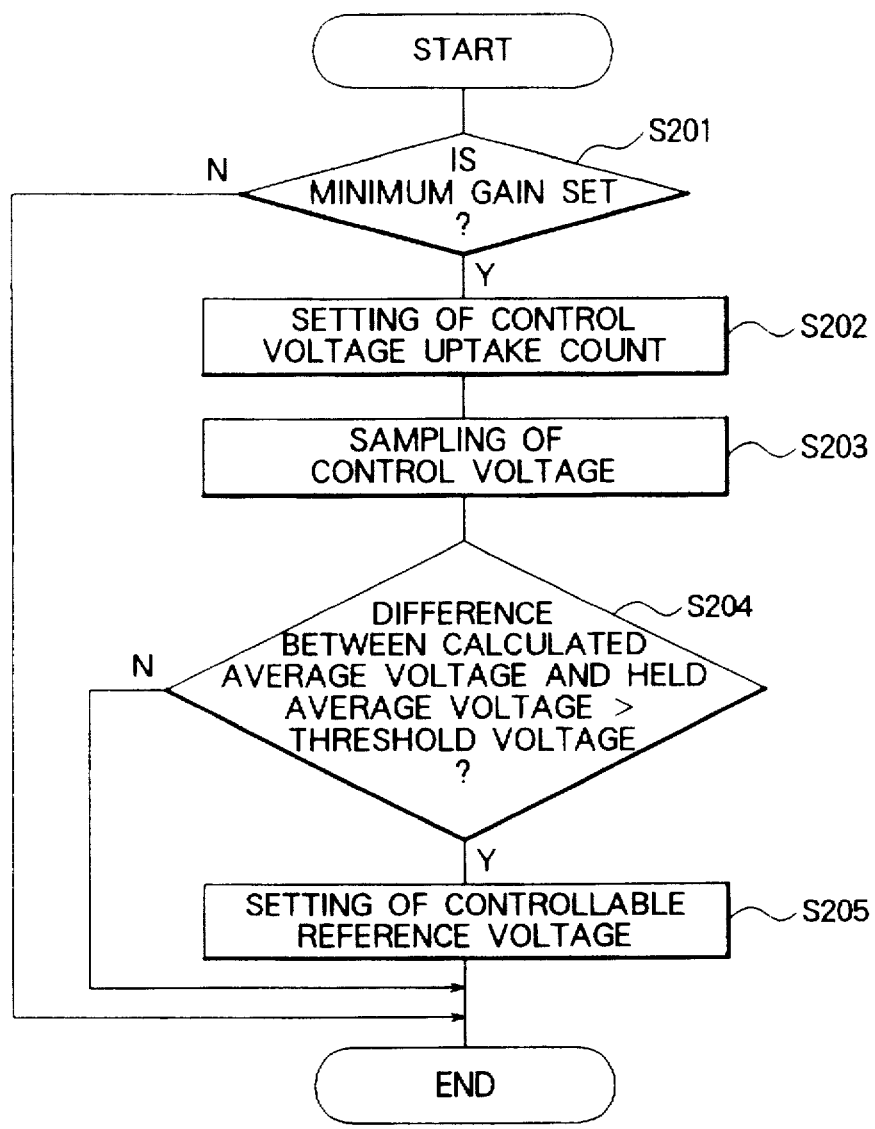
FIG. 6 is a flow chart for use in describing operation of a reference voltage generating circuit in the phase-locked oscillating circuit illustrated in FIG. 4.

Turning to FIG. 6, description will be made as regards operation of the reference voltage generating section 60. The reference voltage generating section 60 determines whether or not the minimum gain is set in the variable gain amplifier 23 at a first stage S201. When the minimum gain is set in the variable gain amplifier 23, the first stage S201 is followed by a second stage S202 at which the control voltage uptake count is set in the reference voltage generating section 60. The second stage S202 proceeds to a third stage S203 at which the average calculating section 62 samples, the control voltage uptake count times, the digital value (corresponding to the control voltage $V_c$) into which the analog-to-digital converter 61 converts the control voltage $V_c$ every the predetermined time interval. The third stage S203 is succeeded by a fourth stage S204 at which the average calculating section 61 calculates the average value of the sampled values and the comparison control section 64 compares the calculated value with the held average value (which is held in the average value holding circuit 63 and corresponds to a current controllable reference voltage $V_{ref}$). When the difference between the calculated average value and the held average value is larger than the predetermined threshold value, the fourth stage S204 is followed by a fifth stage S205 at which the held average value is replaced with the calculated average value. Otherwise, processing comes to an end without replacing of the held average value.

With this structure, the controllable reference voltage $V_{ref}$ gradually approaches a voltage corresponding to the reference frequency $F_{ref}$ of the reference signal $S_{ref}$. More specifically, inasmuch as the output frequency $F_{out}$ of the output signal $S_{out}$ is frequency divided into the divided frequency $F_{out}/N$ of the divided signal $S_{div}$ by the frequency divider 14, the controllable reference voltage $V_{ref}$ approaches to the voltage where the output frequency $F_{out}$ of the output signal $S_{out}$ is in conformity with N times the reference frequency $F_{ref}$ of the reference signal $S_{ref}$. As a result, it is possible to make the voltage-controlled oscillator 13 oscillate the output signal $S_{out}$ having the output frequency $F_{out}$ corresponding to the reference frequency $F_{ref}$ of the reference signal $S_{ref}$ with the minimum gain kept although the reference signal $S_{ref}$ having any reference frequency $F_{ref}$ is supplied to the phase-locked oscillating circuit 10A.

Figure 7:
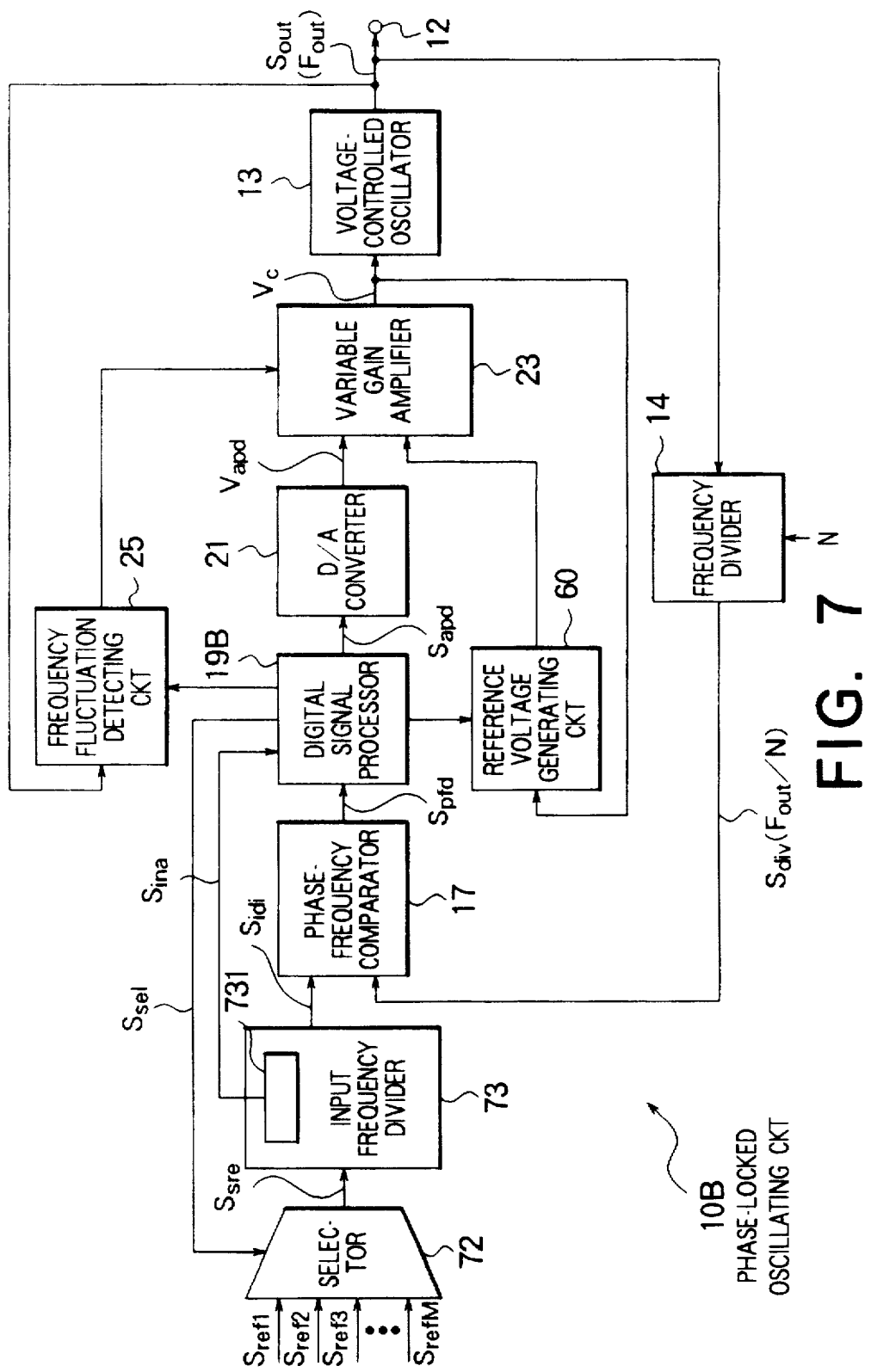
FIG. 7 is a block diagram of a phase-locked oscillating circuit according to a third embodiment of this invention.

Referring to FIG. 7, a phase-locked oscillating circuit 10B according to a third embodiment of this invention is similar in structure to that illustrated in FIG. 4 except that the phase locked oscillating circuit 10B further comprises a selector 72 and an input frequency divider 73 and the digital signal processor is modified to be different from that described in conjunction with FIG. 4 as will later become clear. The digital signal processor is therefore depicted at 19B.

The selector 72 is supplied with first through M-th original reference signals $S_{ref1}$, $S_{ref2}$, $S_{ref3}$, ..., and $S_{refM}$ where M represents a positive integer which is not less than two.

The first through the M-th original reference signals $S_{ref1}$ to $S_{refM}$ are different in frequency and in phase from one another. But, the first through the M-th original reference signals $S_{ref1}$ to $S_{refM}$ have first through M-th original reference frequencies which are near to one another. The selector 72 selects one of the first through the M-th original reference signals $S_{ref1}$ to $S_{refM}$ as a selected reference signal $S_{sre}$ in response to a selection signal $S_{sel}$ supplied from the digital signal processor 19B. The selected reference signal $S_{sre}$ is supplied to the input frequency divider 73.

The input frequency divider 73 is connected to the selector 72 and is supplied with an input dividing number. The input frequency divider 73 frequency divides the selected reference signal $S_{sre}$ on the basis of the input dividing number to produce an input divided signal $S_{idi}$. The input divided signal $S_{idi}$ is supplied to the phase-frequency comparator 17. The input frequency divider 73 has a detection circuit 731 for detecting whether the selected reference signal $S_{sre}$ is present or absent. When the selected reference signal $S_{sre}$ is absent, the detection circuit 731 of the input frequency divider 73 produces an input absence signal $S_{ina}$. The input absence signal $S_{ina}$ is supplied to the digital signal processor 19B.

The phase-frequency comparator 17 detects a phase-frequency difference between the input divided signal $S_{idi}$ and the divided signal $S_{div}$ to produce a phase-frequency difference signal $S_{phd}$ indicative of the phase-frequency difference.

Figure 8:
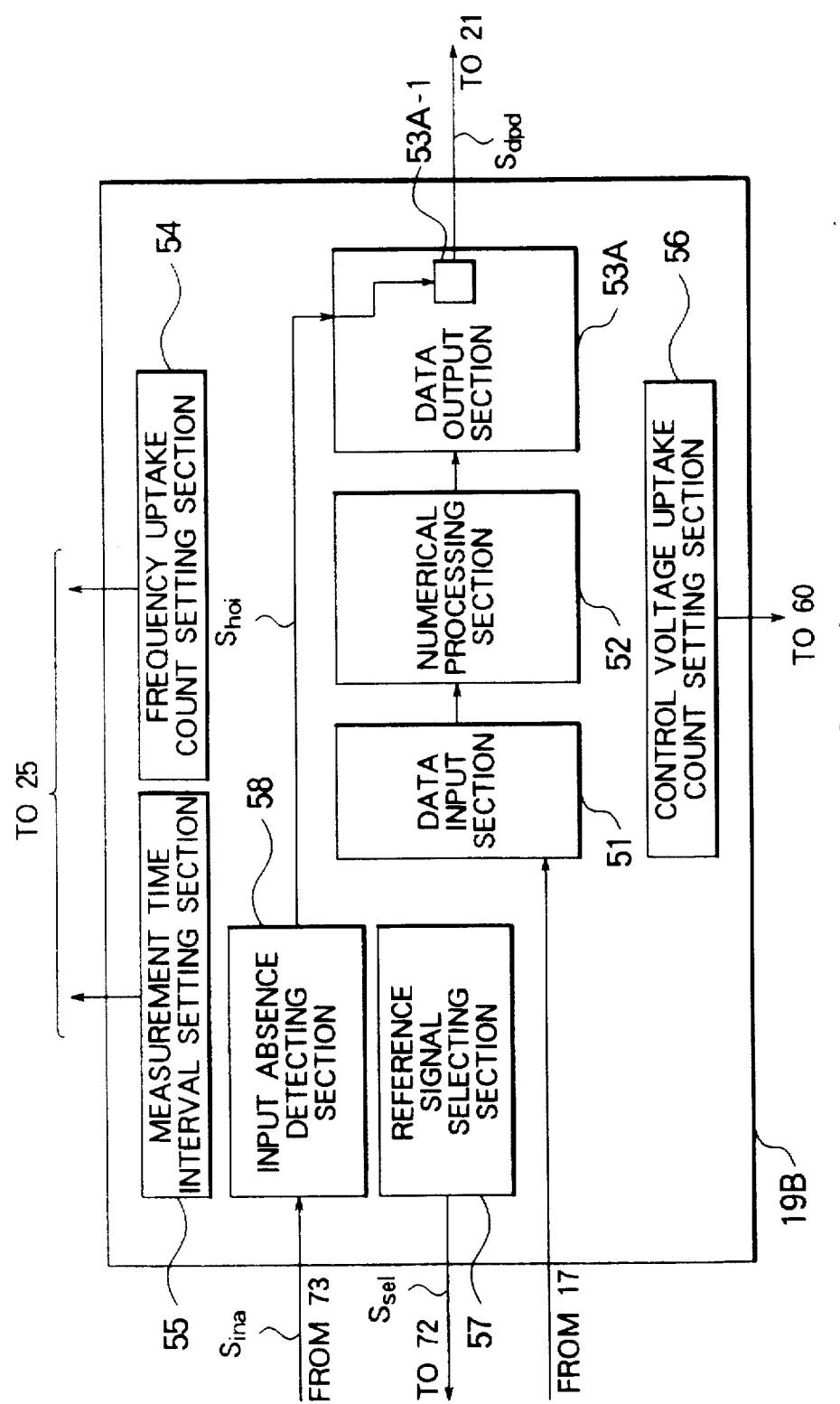
FIG. 8 is a block diagram of a digital signal processor for use in the phase-locked oscillating circuit illustrated in FIG. 7.

Turning to FIG. 8, the digital signal processor 19B is similar in structure to the digital signal processor 19A illustrated in FIG. 5 except that the digital signal processor 19B further comprises a reference signal selecting section 57 and an input absence detecting section 58 and the data output section is modified to be different from that described in conjunction with FIG. 5 as will later become clear. The data output section is therefore depicted at 53A.

The reference signal selecting section 57 supplies the selector 72 with the selection signal $S_{sel}$. The input absence detecting section 58 is supplied with the input absence signal $S_{ina}$ from the input frequency divider 73. Responsive to the input absence signal $S_{ina}$, the input absence detecting section 58 supplies the data output section 53A with a hold indication signal $S_{hoi}$. The data output section 53A includes a holding section 53A-1. Responsive to the hold indication signal $S_{hoi}$, the holding section 53A-1 of the data output section 53A holds, as a held digital phase difference signal, the digital phase difference signal $S_{dpd}$ which is produced immediately before. The held digital phase difference signal is supplied to the digital-to-analog converter 21. Accordingly, it is possible to make the voltage-controlled oscillator 13 freely run at the output frequency $F_{out}$ after the selected reference signal $S_{sre}$ is absent.

In addition, inasmuch as the selected reference signal $S_{sre}$ is frequency divided by the input frequency divider 73, a phase difference between two reference signals supplied to the phase-frequency comparator 17 before and after switching can be reduced to about one by the input dividing number in comparison with a case where the frequency dividing of the selected reference signal is not carried out. In addition, frequency differences between the first through the M-th original reference frequencies of the first through the M-th original reference signals $S_{ref1}$ to $S_{refM}$ are reduced by the frequency dividing. As a result, it is possible to decrease discontinuities in phase and in frequency on switching of the first through the M-th original reference signals $S_{ref1}$ to $S_{refm}$ and it results in carrying out stable oscillation.

While this invention has thus far been described in conjunction with preferred embodiments thereof, it will now be readily possible for those skilled in the art to put this invention into various other manners. For example, a central processing unit (CPU) may be used in place of the digital signal processor serving as the low pass filter in a case where it is unnecessary to operate at a high speed. In addition, the uptake counts for the frequency fluctuation detecting circuit 25 and the reference voltage generating circuit 60 may be set either by switching circuit elements such as switches or by the CPU via a signal path. Furthermore, the number and the value of the gains in the variable gain amplifier 23 are not restricted to those in the above-mentioned embodiments. For example, the variable gain amplifier 23 may have a gain larger than one when the magnitude of the fluctuation in the output frequency $F_{out}$ of the output signal $S_{out}$ is too large. However, it is necessary to reduce the gain to the value less than one when the magnitude of the fluctuation in the output frequency $F_{out}$ of the output signal $S_{out}$ is small. This is because the minimum unit in frequency to be changed must be lower than resolution in the digital phase difference signal $S_{dpd}$.

What is claimed is:

1. A phase-locked oscillating circuit comprising:

a voltage-controlled oscillator responsive to a control voltage for generating an output signal having an output frequency;

a frequency divider, connected to said voltage-controlled oscillator, for frequency dividing the output signal on the basis of a predetermined dividing number to produce a divided signal;

a phase-frequency comparator, connected to said frequency divider and supplied with a reference signal having a reference frequency, for detecting a phase-frequency difference between the divided signal and the reference signal to produce a phase-frequency difference signal indicative of the phase-frequency difference;

digital signal processing means, connected to said phase-frequency comparator, for extracting low frequency components from the phase-frequency difference signal to produce a digital phase difference signal indicative of the low frequency components of the phase-frequency difference signal;

a digital-to-analog converter, connected to said digital processing means, for converting the digital phase difference signal into an analog phase difference voltage;

a variable gain amplifier, having a controllable gain and connected to said digital-to-analog converter and said voltage controlled oscillator, for amplifying the analog phase difference voltage on the basis of the controllable gain into an amplified phase difference voltage, said variable gain amplifier supplying said voltage-controlled oscillator with the amplified phase difference voltage as the control voltage; and frequency fluctuation detecting means, connected to said voltage-controlled oscillator and said variable gain amplifier, for detecting fluctuation in the output frequency of the output signal to control the controllable gain on the basis of magnitude of the fluctuation in the output frequency of the output signal.

2. A phase-locked oscillating circuit as claimed in claim 1, wherein said frequency fluctuation detecting means controls the controllable gain so as to have a value less than one when the magnitude of the fluctuation in the output frequency is less than a predetermined threshold value.

3. A phase-locked oscillating circuit as claimed in claim 1, wherein said frequency fluctuation detecting means comprises:

a frequency counting section, connected to said voltage-controlled oscillator, for measuring the output frequency of the output signal to produce a measured frequency signal indicative of the output frequency;

a time series fluctuation analyzing section, connected to said frequency counting section, for analyzing the fluctuation in the output frequency of the output signal in time series in reference with the measured frequency signal to produce a detected frequency fluctuation signal indicative of the magnitude of the fluctuation in the output frequency of the output signal; and a gain setting section, connected to said time series fluctuation analyzing section and said variable gain amplifier, for setting, in response to the detected frequency fluctuation signal, the controllable gain in said variable gain amplifier.

4. A phase-locked oscillating circuit comprising:

a voltage-controlled oscillator responsive to a control voltage for generating an output signal having an output frequency;

a frequency divider, connected to said voltage-controlled oscillator, for frequency dividing the output signal on the basis of a predetermined dividing number to produce a divided signal;

a phase-frequency comparator, connected to said frequency divider and supplied with a reference signal having a reference frequency, for detecting a phase-frequency difference between the divided signal and the reference signal to produce a phase-frequency difference signal indicative of the phase-frequency difference;

digital signal processing means, connected to said phase-frequency comparator, for extracting low frequency components from the phase-frequency difference signal to produce a digital phase difference signal indicative of the low frequency components of the phase-frequency difference signal;

a digital-to-analog converter, connected to said digital processing means, for converting the digital phase difference signal into an analog phase difference voltage;

a variable gain amplifier, having a controllable gain, supplied with a controllable reference voltage, and connected to said digital-to-analog converter and said voltage-controlled oscillator, for amplifying a difference voltage between the analog phase difference voltage and the controllable reference voltage on the basis of the controllable gain into an amplified phase difference voltage, said variable gain amplifier supplying said voltage-controlled oscillator with the amplified phase difference voltage as the control voltage;

frequency fluctuation detecting means, connected to said voltage-controlled oscillator and said variable gain amplifier, for detecting fluctuation in the output frequency of the output signal to control the controllable gain on the basis of magnitude of the fluctuation in the output frequency of the output signal; and reference voltage generating means, connected to said variable gain amplifier, for supplying said variable gain amplifier with the controllable reference voltage in response to the control voltage.

5. A phase-locked oscillating circuit as claimed in claim 4, wherein said frequency fluctuation detecting means controls the controllable gain so as to have a value less than one when the magnitude of the fluctuation in the output frequency of the output signal is less than a predetermined threshold value.

6. A phase-locked oscillating circuit as claimed in claim 5, wherein said frequency fluctuation detecting means comprises:

a frequency counting section, connected to said voltage-controlled oscillator, for measuring the output frequency of the output signal to produce a measured frequency signal indicative of the output frequency;

a time series fluctuation analyzing section, connected to said frequency counting section, for analyzing the fluctuation in the output frequency of the output signal in time series in reference with the measured frequency signal to produce a detected frequency fluctuation signal indicative of the magnitude of the fluctuation in the output frequency of the output signal; and a gain setting section, connected to said time series fluctuation analyzing section and said variable gain amplifier, for setting, in response to the detected frequency fluctuation signal, the controllable gain in said variable gain amplifier.

7. A phase-locked oscillating circuit as claimed in claim 4, wherein said reference voltage generating means comprises:

an average voltage acquisition section, connected to said variable gain amplifier, for calculating an average voltage by averaging the control voltage during a predetermined time interval to produce a calculated average voltage;

an average voltage holding section, connected to said average voltage acquisition section, for holding the calculated average voltage as a held average voltage; and a reference voltage output section, connected to said average voltage holding section and said variable gain amplifier, for supplying said variable gain amplifier with the held average voltage as the controllable reference voltage.

8. A phase-locked oscillating circuit as claimed in claim 7, wherein said average voltage holding section comprises:

an average voltage holding circuit, connected to said average voltage acquisition section, for holding, in response to a hold indication signal, the calculated average voltage as a refreshed held average voltage; and a comparison control section, connected to said average voltage holding circuit and said average voltage acquisition section, for comparing a previously held average voltage with the calculated average voltage to produce the hold indication signal when a difference voltage between the previously held average voltage and the calculated average voltage is not less than a predetermined voltage.

9. A phase-locked oscillating circuit comprising:

a voltage-controlled oscillator responsive to a control voltage signal for generating an output signal having an output frequency;

a first frequency divider, connected to said voltage-controlled oscillator, for frequency dividing the output signal on the basis of a first dividing number to produce a first divided signal;

selecting means, supplied with a plurality of original reference signals having original reference frequencies, for selecting one of the original reference signals as a selected reference signal;

a second frequency divider, connected to said selecting means, for frequency dividing the selected reference signal on the basis of a second dividing number to produce a second divided signal;

a phase-frequency comparator, connected to said first and said second frequency dividers, for detecting a phase-frequency difference between the first and the second divided signals to produce a phase-frequency difference signal indicative of the phase-frequency difference;

digital signal processing means, connected to said phase-frequency comparator, for extracting low frequency components from the phase-frequency difference signal to produce a digital phase difference signal indicative of the low frequency components of the phase-frequency difference signal;

a digital-to-analog converter, connected to said digital processing means, for converting the digital phase difference signal into an analog phase difference voltage;

a variable gain amplifier, having a controllable gain, supplied with a controllable reference voltage, and connected to said digital-to-analog converter and said voltage controlled oscillator for amplifying a difference voltage between the analog phase difference voltage and the controllable reference voltage on the basis of the controllable gain into an amplified phase difference voltage, said variable gain amplifier supplying said voltage-controlled oscillator with the amplified phase difference voltage as the control voltage;

frequency fluctuation detecting means, connected to said voltage-controlled oscillator and said variable gain amplifier, for detecting fluctuation in the output frequency of the output signal to control the controllable gain on the basis of magnitude of the fluctuation in the output frequency of the output signal; and reference voltage generating means, connected to said variable gain amplifier, for supplying said variable gain amplifier with the controllable reference voltage in response to the control voltage.

10. A phase-locked oscillating circuit as claimed in claim 9, wherein said frequency fluctuation detecting means controls the controllable gain so as to have a value less than one when the magnitude of the fluctuation in the output frequency of the output signal is less than a predetermined threshold value.

11. A phase-locked oscillating circuit as claimed in claim 10, wherein said frequency fluctuation detecting means comprises:

a frequency counting section, connected to said voltage-controlled oscillator, for measuring the output frequency of the output signal to produce a measured frequency signal indicative of the output frequency;

a time series fluctuation analyzing section, connected to said frequency counting section, for analyzing the fluctuation in the output frequency of the output signal in time series in reference with the measured frequency signal to produce a detected frequency fluctuation signal indicative of the magnitude of the fluctuation in the output frequency of the output signal; and a gain setting section, connected to said time series fluctuation analyzing section and said variable gain amplifier, for setting, in response to the detected frequency fluctuation signal, the controllable gain in said variable gain amplifier.

12. A phase-locked oscillating circuit as claimed in claim 9, wherein said reference voltage generating means comprises:

an average voltage acquisition section, connected to said variable gain amplifier, for calculating an average voltage by averaging the control voltage during a predetermined time interval to produce a calculated average voltage;

an average voltage holding section, connected to said average voltage acquisition section, for holding the calculated average voltage as a held average voltage; and a reference voltage output section, connected to said average voltage holding section and said variable gain amplifier, for supplying said variable gain amplifier with the held average voltage as the controllable reference voltage.

13. A phase-locked oscillating circuit as claimed in claim 12, wherein said average voltage holding section comprises:

an average voltage holding circuit, connected to said average voltage acquisition section, for holding, in response to a hold indication signal, the calculated average voltage as a refreshed held average voltage; and a comparison control section, connected to said average voltage holding circuit and said average voltage acquisition section, for comparing a previously held average voltage with the calculated average voltage to produce the hold indication signal when a difference voltage between the previously held average voltage and the calculated average voltage is not less than a predetermined voltage.

14. A phase-locked oscillating circuit comprising:

a voltage-controlled oscillator responsive to a control voltage signal for generating an output signal having an output frequency;

a frequency divider, connected to said voltage-controlled oscillator, for frequency dividing the output signal on the basis of a predetermined dividing number to produce a divided signal;

a phase-frequency comparator, connected to said frequency divider and supplied with a reference signal having a reference frequency, for detecting a phase-frequency difference between the divided signal and the reference signal to produce a phase-frequency difference signal indicative of the phase-frequency difference;

signal absence detecting means for detecting absence of the reference signal to produce an input absence signal on absence of the reference signal;

digital signal processing means, connected to said phase-frequency comparator and said signal absence detecting means, for extracting low frequency components from the phase-frequency difference signal to produce a digital phase difference signal indicative of the low frequency components of the phase-frequency difference signal, said digital signal processing means holding, in response to the input absence signal, the digital phase difference signal produced immediately before as a held digital phase difference signal;

a digital-to-analog converter, connected to said digital processing means, for converting the held digital phase difference signal into an analog phase difference voltage;

a variable gain amplifier, having a controllable gain, supplied with a controllable reference voltage, and connected to said digital-to-analog converter and said voltage-controlled oscillator, for amplifying a difference voltage between the analog phase difference voltage and the controllable reference voltage on the basis of the controllable gain into an amplified phase difference voltage, said variable gain amplifier supplying said voltage-controlled oscillator with the amplified phase difference voltage as the control voltage;

frequency fluctuation detecting means, connected to said voltage-controlled oscillator and said variable gain amplifier, for detecting fluctuation in the output frequency of the output signal to control the controllable gain on the basis of magnitude of the fluctuation in the output frequency of the output signal; and reference voltage generating means, connected to said variable gain amplifier, for supplying said variable gain amplifier with the controllable reference voltage in response to the control voltage.

15. A phase-locked oscillating circuit as claimed in claim 14, wherein said frequency fluctuation detecting means controls the controllable gain so as to have a value less than one when the magnitude of the fluctuation in the output frequency of the output signal is less than a predetermined threshold value.

16. A phase-locked oscillating circuit as claimed in claim 15, wherein said frequency fluctuation detecting means comprises:

a frequency counting section, connected to said voltage-controlled oscillator, for measuring the output frequency of the output signal to produce a measured frequency signal indicative of the output frequency;

a time series fluctuation analyzing section, connected to said frequency counting section, for analyzing the fluctuation in the output frequency of the output signal in time series in reference with the measured frequency signal to produce a detected frequency fluctuation signal indicative of the magnitude of the fluctuation in the output frequency of the output signal; and a gain setting section, connected to said time series fluctuation analyzing section and said variable gain amplifier, for setting, in response to the detected frequency fluctuation signal, the controllable gain in said variable gain amplifier.

17. A phase-locked oscillating circuit as claimed in claim 14, wherein said reference voltage generating means comprises:

an average voltage acquisition section, connected to said variable gain amplifier, for calculating an average voltage by averaging the control voltage during a predetermined time interval to produce a calculated average voltage;

an average voltage holding section, connected to said average voltage acquisition section, for holding the calculated average voltage as a held average voltage; and a reference voltage output section, connected to said average voltage holding section and said variable gain amplifier, for supplying said variable gain amplifier with the held average voltage as the controllable reference voltage .

18. A phase-locked oscillating circuit as claimed in claim 17, wherein said average voltage holding section comprises:

an average voltage holding circuit, connected to said average voltage acquisition section, for holding, in response to a hold indication signal, the calculated average voltage as a refreshed held average voltage; and a comparison control section, connected to said average voltage holding circuit and said average voltage acquisition section, for comparing a previously held average voltage with the calculated average voltage to produce the hold indication signal when a difference voltage between the previously held average voltage and the calculated average voltage is not less than a predetermined voltage.

\* \* \* \* \*